United States Patent
Arnold et al.

(10) Patent No.: US 8,185,335 B2
(45) Date of Patent: May 22, 2012

(54) MAGNETIC RESONANCE SYSTEM AND METHOD FOR SPATIALLY-DEPENDENT ADJUSTMENT OF SYSTEM PARAMETERS

(75) Inventors: Thomas Arnold, Nuremberg (DE); Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 536 days.

(21) Appl. No.: 12/166,745

(22) Filed: Jul. 2, 2008

(65) Prior Publication Data
US 2009/0012736 A1 Jan. 8, 2009

(30) Foreign Application Priority Data
Jul. 2, 2007 (DE) .......................... 10 2007 030 624

(51) Int. Cl.
*G01R 35/00* (2006.01)
*A61B 5/05* (2006.01)
(52) U.S. Cl. ............. 702/85; 702/40; 600/410; 600/415
(58) Field of Classification Search ...................... 702/85
See application file for complete search history.

(56) References Cited

U.S. PATENT DOCUMENTS

| 5,657,757 A * | 8/1997 | Hurd et al. ..................... 600/413 |
| 7,145,338 B2 | 12/2006 | Campagna et al. |
| 2003/0144587 A1 * | 7/2003 | Ma et al. ....................... 600/410 |
| 2007/0108976 A1 * | 5/2007 | Morich et al. ................ 324/309 |
| 2008/0125977 A1 * | 5/2008 | Anquetil et al. ................ 702/19 |

* cited by examiner

*Primary Examiner* — Jonathan C Teixeira Moffat
(74) *Attorney, Agent, or Firm* — Schiff Hardin LLP

(57) ABSTRACT

A magnetic resonance apparatus is operated with continuous movement of an examination subject through a measurement volume of the apparatus. At each successively-occupied position of the examination subject within the measurement volume during the continuous movement, magnetic resonance data are acquired with system parameters, each having system parameter values. Contemporaneously with each data acquisition at each position, the acquired data are evaluated as to the effect produced by the system parameter values employed to acquire the data. The system parameter values are then adapted to cause the effect to correspond to a target value, and the adapted system parameters are then used to acquire data at the next-successive position occupied by the examination subject in the continuous movement.

9 Claims, 2 Drawing Sheets

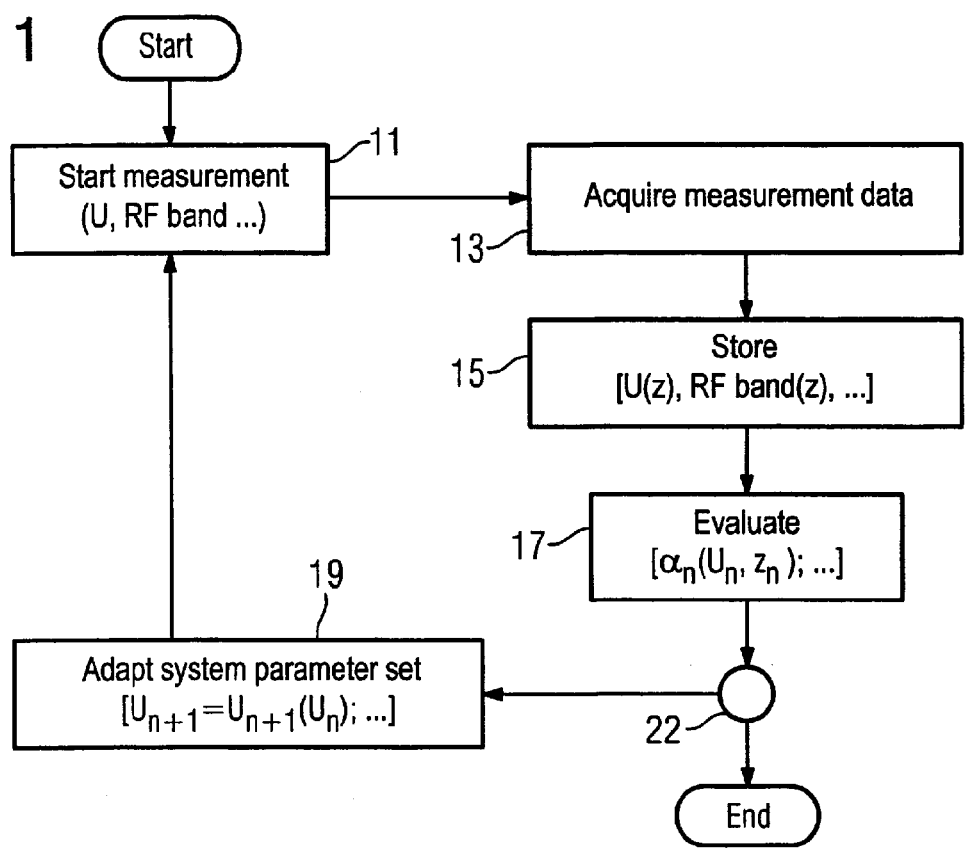
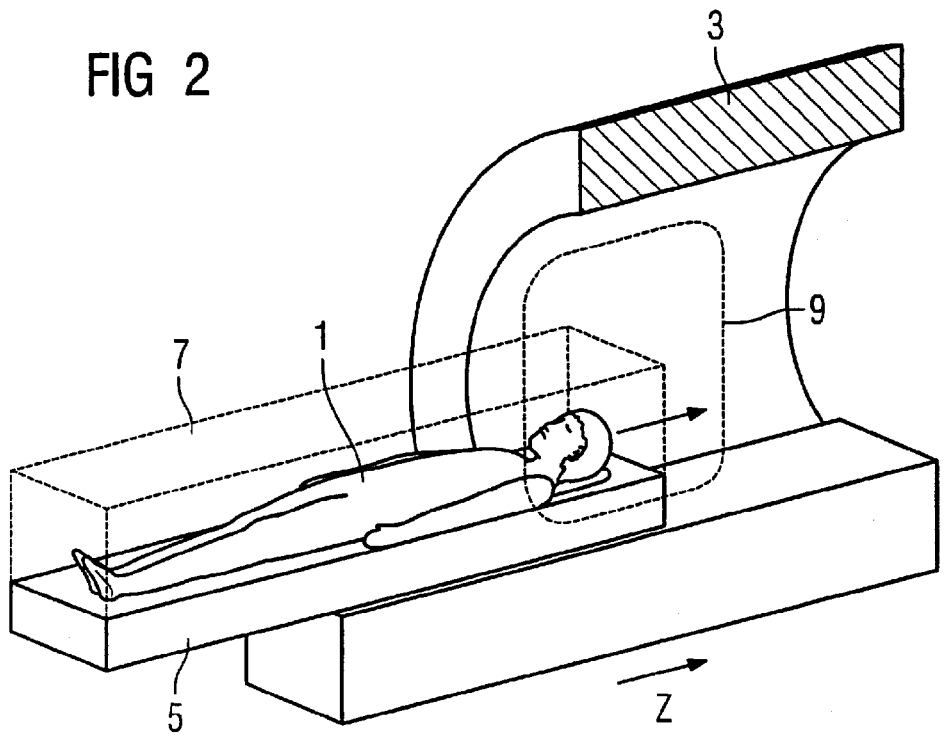

MAGNETIC RESONANCE SYSTEM AND METHOD FOR SPATIALLY-DEPENDENT ADJUSTMENT OF SYSTEM PARAMETERS

BACKGROUND OF THE INVENTION

1. Field of the Invention

The present invention concerns a method for spatially-dependent (location-dependent) adjustment of system parameters of a magnetic resonance apparatus given continuous movement of an examination subject through a measurement volume of the magnetic resonance apparatus.

The invention likewise concerns a computer-readable medium encoded with programming instructions as well as a magnetic resonance apparatus for implementation of the method.

2. Description of the Prior Art

Various system parameters must be known a priori for the successful implementation of an imaging magnetic resonance (MR) examination. Some of these parameters are defined only once (normally during the initial operation of an MR apparatus) and are then available unchanged for all further measurements with the MR apparatus. Examples for such system parameters are the non-linearity of the radio-frequency system (RF system) of the MR apparatus and the inherent delay of the gradient system of the MR apparatus due to eddy currents.

Other system parameters are dependent on, for example, the physiology of a patient or examination subject and/or on the position of the patient in the MR apparatus during the examination. These system parameters must therefore be defined individually by adjustment measurements before each imaging or spectroscopic measurement. These examination subject-dependent system parameters describe, for example, the field inhomogeneities caused in the MR apparatus by the patient and the load situation of the RF system. A few important examples for such examination subject-dependent system parameters are the resonance frequency of the proton nuclei in the examination subject and the reference amplitude of a normalized RF pulse, for example a 180° pulse.

Such adjustment measurements have conventionally been iteratively implemented on a stationary examination subject. An iterative procedure is necessary because the desired adjustment parameters can be determined by a single measurement value only for a "physically ideal" MR apparatus. Real MR apparatuses, in particular at higher field strengths, such as as of 3 Tesla (for example), exhibit distinct deviations from the ideal behavior that can only be compensated by iterative methods.

Therefore the effect achieved with the employed system parameters is an iterative convergence on a target value for a precise adjustment. For example, a measurement is implemented with a start value for the reference amplitude of a normalized RF pulse and the achieved flip angle is determined. Assuming an ideal, linear relationship between the reference amplitude and the flip angle, a reference amplitude is calculated that should excite the desired target flip angle. This is repeated until the achieved flip angle is located within a convergence range around the target flip angle, i.e. until the achieved flip angle has sufficiently converged on the target flip angle.

A further example is the adjustment of a radiated RF band such that the resonance frequency of the proton nuclei in the examination subject represents the center frequency of the RF band. Further system parameters to be iteratively adjusted and methods for adjustment are known for adjustment measurements implemented while stationary.

Since it cannot be predicted a priori how many iterations will be required in order to converge the effect on the desired value, no advance conclusion as to the duration of a converged adjustment measurement can be made.

This means that such iterative methods cannot be used when only a fixed time duration is available for an adjustment measurement, or if only a single iteration is possible due to technical boundary conditions. Both conditions occur in adjustment measurements with continuous table movement. In that situation, system parameters must be determined not only at one stationary position but also along an entire range of positions of a patient or examination subject relative to the MR apparatus without influencing the continuous movement of the table.

A method in which a low-resolution calibration measurement is implemented, in which method the examination region is shifted continuously through the acquisition region of an MR apparatus, is described in DE 10 2005 019 859 A1. Among other things, technical information for adjustment of the MR apparatus is obtained from acquired magnetic resonance signals dependent on the position of the patient bed. Measurement protocol parameters are generated from the acquired technical information, from which measurement protocol parameters a measurement protocol is generated for a final, high-resolution magnetic resonance examination.

The absence iterations limits the precision of the attained measurement protocol parameters (adjustment values for system parameters) since the deviations of a real MR apparatus from the ideal behavior that are described above are not taken into account.

SUMMARY OF THE INVENTION

An object of the present invention is to provide a method with which an adjustment measurement of an MR apparatus exhibits a high precision despite continuous movement of the examination subject through the MR apparatus.

The method is based on the insight that examination subject-dependent system parameters that should achieve a specific effect change continuously (thus not erratically) with the position in the examination subject. This is primarily due to the fact that the examination subject (such as, for example, a patient) also does not change erratically in terms of his properties, dependent upon position.

The method according to the invention for spatially-dependent adjustment of system parameters of a magnetic resonance apparatus given continuous movement of an examination subject through a measurement volume of the magnetic resonance apparatus includes the following steps:

a) starting a measurement in the measurement volume of the magnetic resonance apparatus with a system parameter set, wherein the examination subject is located at a first position, b) acquisition of measurement data, c) storage of the system parameter values of the system parameter set with a respective position of the examination subject in a magnetic resonance apparatus at the point in time of a use of the respective system parameter of the system parameter set during the measurement, d) evaluation of the acquired measurement data in regards to the effect achieved with the employed system parameter values, e) adaptation of the system parameter values of the system parameter set under consideration of the evaluation of the last measurement such that, assuming idealized relationships between the system parameters and the respective effect, the respective effect corresponds to a target value, f) starting a new measurement in the measurement volume of the magnetic resonance apparatus with the system parameter set with the adapted system parameter values, wherein the examination subject is located at an altered position, and g) repetition of the steps b) through f) until the examination subject to be examined is completely examined (scanned).

By feeding the system parameter values in step e) back to successive positions in the examination subject to be examined, a high precision is achieved in the adaptation of the system parameter values. At the same time the movement of the examination subject is not influenced by the method according to the invention, which is welcome to the patient, and the measurement is kept short. If applicable, only a part of an examination subject to be examined is understood to be represented by the term "an examination subject to be examined".

The pairs composed of system parameters and associated position that are acquired in accordance with the method enable a precise adjustment of the MR apparatus for further examinations of the examination subject to be examined. The advantages associated with a precise adjustment of system parameters are, among other things, an improved image quality and the possibility of a progressive monitoring of the specific absorption rate (SAR).

In an embodiment, the acquired measurement data of each measurement represent image information at least about parts of the examination subject. In this manner a rough picture of the examination subject, based on which further examinations can be planned, can be generated simultaneously with the adjustment measurements. The rough image can be generated either in the form of a 3D data set from reconstructed slice images or in the form of a MIP image (MIP: Maximum Intensity Projection). Moreover, this image information achieves a higher quality due to the use of adapted system parameters in the measurement of image information.

The above object also is achieved in accordance with the present invention by a magnetic resonance apparatus configured to operate in accordance with the above-described method, and all embodiments thereof.

The above object also is achieved in accordance with the present invention by a computer-readable medium encoded with programming instructions, the computer-readable medium being loadable into a control computer of a magnetic resonance system and the programming instructions then causing the control computer to operate the magnetic resonance system in accordance with the above-described method, including all embodiments thereof.

BRIEF DESCRIPTIONS OF THE DRAWINGS

FIG. 1 is a schematic flowchart of an embodiment of the method.

FIG. 2 is a simplified illustration of an MR apparatus for implementation of the method, shown in section.

DESCRIPTION OF THE PREFERRED EMBODIMENTS

Figure 3:
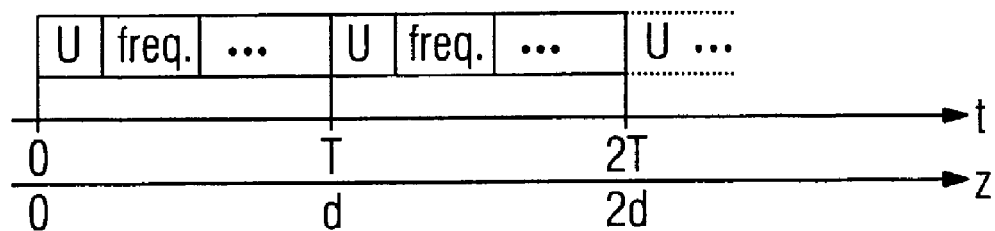
FIG. 3 is a schematic representation of an advantageous execution embodiment of the method.

FIG. 1 explains the method using an exemplary flowchart. FIG. 2 is also referenced for explanation.

A patient 1 should be examined with the aid of an MR apparatus 3 that has a displaceable patient bed 5. An examination region 7 to be examined is thereby larger than a measurement region 9 of the MR apparatus 3. For acquisition of the entire examination region 7 to be examined, the patient on the patient bed 5 is moved through the acquisition region 9 of the MR apparatus 3 in the z-direction, thus in the axial direction.

An adjustment of system parameters necessary for the examination includes the following steps. The patient bed 5 with the patient 1 positioned on it is moved to a start position (for example z=0) and the measurement is started with a system parameter set (Block 11). After the start 11 the measurement, the patient bed 5 is moved continuously through the MR apparatus 3 in the z-direction.

A system parameter set includes at least one system parameter such as, for example, a reference amplitude U of a normalized RF pulse or a minimal and maximal frequency of an RF band to be radiated. The system parameters are populated (set) with standard values, for example, during the first measurement with the system parameter set.

The measurement data generated via the measurement are acquired (Block 13) and the employed values of the system parameters of the system parameter set are stored together with the position z(t) of the patient bed 5 at the point in time t of the use of the system parameter during the measurement (Block 15).

The acquired measurement data are evaluated (Block 17) in order in particular to obtain the effects achieved via the employed system parameter values of the system parameter set such as, for example, the flip angle $\alpha$ achieved with the employed value for the reference amplitude U.

A query 22 determines whether the entire examination subject to be examined has already been measured, and thus whether the entire examination region 7 to be examined has been moved through the measurement region 9 of the MR apparatus 3. This occurs, for example, by establishing the current position of the patient bed 5 and comparing this position with a maximal position. If the entire examination subject to be examined has already been measured, the method and therefore the measurements end.

If the examination region to be examined has not yet been completely measured, the values of the system parameters of the system parameter set are adapted for a next measurement (Block 19).

The adaptation 19 thus ensues on the basis of the effects achieved with the last system parameter values and the assumption of an ideal relationship between system parameter and its effect. For example, if the reference amplitude had the value $U_n$ in the last measurement and a flip angle $\alpha_n$ was achieved with this reference amplitude $U_n$, the value of the reference amplitude $U_{n+1}$ is adapted for the next measurement such that:

$$U_{n+1} = U_n \frac{\alpha_{target}}{\alpha_n},$$

wherein $\alpha_{target}$ is the target value of the flip angle.

However, since the real MR apparatus 3 does not behave linearly, in the next measurement with the reference amplitude $U_{n+1}$ the desired value of the flip angle $\alpha_{target}$ will not be precisely met. Nevertheless, a high precision in the spatially-dependent adjustment of the system parameters is achieved via such a feedback of the system parameter values of a measurement with the evaluation of the last measurement.

The fact that the examination subject to be examined was continuously moved further contributes only slightly to the non-linearity of the real MR apparatus.

The values of other system parameters are adapted as in stationary iterative adjustment methods, for example.

If the system parameter value is adapted in this manner, a new measurement starts and the cycle of the method steps proceeds again beginning at Block 11.

All system parameters of the system parameter set are advantageously detected in succession, in particular in a nested manner. Each measurement has a fixed time length. The same time duration T thereby always elapses until a specific system parameter is measured again. Since the patient bed 5 moves with continuous speed, the position of the patient bed 5 after a time duration T has changed by the distance d. A set of equidistant sampling points therefore results for each system parameter.

In the planning of a measurement sequence for such a nested adjustment measurement of the system parameters it is to be noted that the time duration T is sufficiently large to implement an adaptation of the system parameter values in the manner specified above. In addition to measurements for the adjustment of the different system parameters, measurements for the acquisition of image information can also be interlaced into a time duration T.

Such image data can be used for the planning of a further examination, for example. Since already adapted system parameters are used in such a measurement of image information, these achieve a higher quality than image information that are measured with un-adapted standard system parameters, for example.

Figure 4:
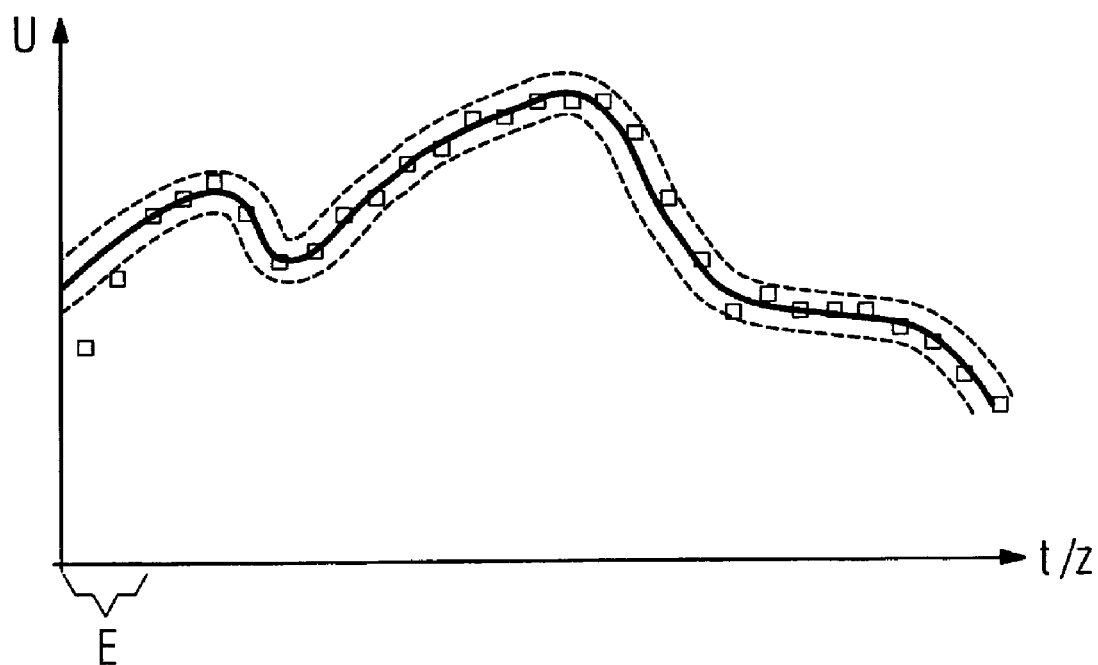
FIG. 4 is a schematic, spatial and time curve of a reference amplitude.

FIG. 4 shows an example of the curve of the reference amplitude U dependent on the axial coordinate z or the time t for an examination subject borne in a specific manner. The solid line represents the actual curve of the reference amplitude I with which a target flip angle of, for example, 180° is achieved at the respective coordinate z or, respectively, t. The dashed lines above and below this solid line mark the upper or, respectively, lower bound of the convergence range U±dU, i.e. the allowable tolerance.

The equidistant sampling points acquired via the method according to the invention are represented by squares. It can be seen that, after a transient phase E of only a few sampling points (typically 2 to 4), all determined sampling points are located within the convergence region.

The sampling points so acquired are used for a precise adjustment of the system parameters for a following imaging or spectroscopic examination of the examination subject to be examined.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for spatially-dependent adjustment of system parameters of a magnetic resonance apparatus, comprising the steps of:
   (a) continuously moving an examination subject through a measurement volume of a magnetic resonance apparatus to cause the examination subject to successively occupy different positions, respectively at different points in time, in the measurement volume;
   (b) with the examination subject occupying a first of said positions at a first of said points in time, acquiring magnetic resonance data from the examination subject by operating the magnetic resonance apparatus using a system parameter set comprising a plurality of system parameters, each having a system parameter value;
   (c) contemporaneously with said first of said points in time, storing said system parameter values of the system parameter set in a memory in association with said first of said points in time;
   (d) in a computerized processor, automatically evaluating the measurement data acquired at said first of said points in time, as to an effect achieved with the use of said system parameter values with the examination subject at said first of said positions;
   (e) in said processor, automatically adapting said system parameter values to cause, assuming idealized relationships between said system parameters and said effect, said effect to correspond to a target value;
   (f) continuing to move the examination subject through the measurement volume to cause the examination subject to occupy a next-successive position in said measurement volume at a next-successive point in time, respectively following said first of said positions and said first of said points in time; and
   (g) repeatedly adapting said system parameter values by repeating steps (b) through (f) for said next-successive position and said next-successive point in time, and a plurality of additional next-successive positions respectively occupied at a plurality of additional next-successive points in time, to allow said processor in step (e), to iteratively adapt said system parameter to cause said effect to correspond said target value, as and until all desired magnetic resonance data in the measurement volume are acquired from the examination subject.

2. A method according to claim 1, executing each said measurement with a defined time length.

3. A method according to claim 1 comprising employing at least one system parameter in each system parameter set.

4. A method according to claim 1 comprising, in each said measurement, querying the effect of each individual one said system parameters in succession.

5. A method according to claim 1 comprising executing the repetitions directly after one another.

6. A method according to claim 1 comprising employing the system parameter values stored with the respective position of the examination subject for adjustment of the system parameters in a subsequent examination of the examination subject.

7. A method according to claim 1 comprising moving the examination subject through the magnetic resonance apparatus while repeating steps (b) through (f) in step (g) to acquire said magnetic resonance measurement data wherein the acquired magnetic resonance measurement data comprises image information at least about portions of the examination subject.

8. A non-transitory, computer-readable medium encoded with programming instructions, said computer-readable medium being loadable into a computerized control unit of a magnetic resonance apparatus comprising a magnetic resonance data acquisition unit, said programming instructions implementing spatially dependent adjustment of system parameters of the magnetic resonance apparatus by causing said computerized control unit to:
   (a) operate the magnetic resonance data acquisition unit to continuously move an examination subject through a measurement volume of a magnetic resonance data acquisition unit to cause the examination subject to successively occupy different positions, respectively at different points in time, in the measurement volume;

(b) with the examination subject occupying a first of said positions at a first of said points in time, operate the magnetic resonance data acquisition unit to acquire magnetic resonance data from the examination subject using a system parameter set comprising a plurality of system parameters, each having a system parameter value;

(c) contemporaneously with said first of said points in time, store said system parameter values of the system parameter set in a memory in association with said first of said points in time;

(d) automatically evaluate the measurement data acquired at said first of said points in time, as to an effect achieved with the use of said system parameter values with the examination subject at said first of said positions;

(e) automatically adapt said system parameter values to cause, assuming idealized relationships between said system parameters and said effect, said effect to correspond to a target value;

(f) continue to move the examination subject through the measurement volume to cause the examination subject to occupy a next-successive position in said measurement volume at a next-successive point in time, respectively following said first of said positions and said first of said points in time; and (g) repeatedly adapt said system parameter values by repeating steps (b) through (f) for said next-successive position and said next-successive point in time, and a plurality of additional next-successive positions respectively occupied at a plurality of additional next-successive points in time, to allow said processor in step (e), to iteratively adapt said system parameter to cause said effect to correspond said target value, as and until all desired magnetic resonance data in the measurement volume are acquired from the examination subject.

9. A magnetic resonance apparatus comprising:

a magnetic resonance data acquisition unit comprising a continuously movable patient bed adapted to receive an examination subject thereon;

a computerized control unit in communication with said magnetic resonance data acquisition unit;

a memory in communication with said computerized control unit; and said computerized control unit being configured to: (a) continuously move an examination subject through a measurement volume of the magnetic resonance data acquisition unit to cause the examination subject to successively occupy different positions, respectively at different points in time, in the measurement volume; (b) with the examination subject occupying a first of said positions at a first of said points in time, acquire magnetic resonance data from the examination subject by operating the magnetic resonance data acquisition unit using a system parameter set comprising a plurality of system parameters, each having a system parameter value; (c) contemporaneously with said first of said points in time, store said system parameter values of the system parameter set in said memory in association with said first of said points in time; (d) automatically evaluate the measurement data acquired at said first of said points in time, as to an effect achieved with the use of said system parameter values with the examination subject at said first of said positions; (e) automatically adapt said system parameter values to cause, assuming idealized relationships between said system parameters and said effect, said effect to correspond to a target value; (f) continue to move the examination subject through the measurement volume to cause the examination subject to occupy a next-successive position in said measurement volume at a next-successive point in time, respectively following said first of said positions and said first of said points in time; and (g) repeatedly adapt said system parameter values by repeating steps (b) through (f) for said next-successive position and said next-successive point in time, and a plurality of additional next-successive positions respectively occupied at a plurality of additional next-successive points in time, to allow said processor in (e), to iteratively adapt said system parameter to cause said effect to correspond said target value, as and until all desired magnetic resonance data in the measurement volume are acquired from the examination subject.

* * * * *